United States Patent
Chen et al.

(10) Patent No.: US 9,244,122 B2
(45) Date of Patent: Jan. 26, 2016

(54) METHOD OF DETERMINING PERFORMANCE OF A CHIP OF AN INTEGRATED-CIRCUIT DESIGN AND AN APPARATUS AND AN INTEGRATED CIRCUIT USING THE SAME

(71) Applicants: Shi-Hao Chen, Nantou County (TW); Yung-Sheng Fang, Kaohsiung (TW); Szu-Pang Mu, Hsinchu (TW); Mango Chia-Tso Chao, Hsinchu (TW)

(72) Inventors: Shi-Hao Chen, Nantou County (TW); Yung-Sheng Fang, Kaohsiung (TW); Szu-Pang Mu, Hsinchu (TW); Mango Chia-Tso Chao, Hsinchu (TW)

(73) Assignees: Global Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 253 days.

(21) Appl. No.: 13/959,764

(22) Filed: Aug. 6, 2013

(65) Prior Publication Data

US 2015/0042369 A1    Feb. 12, 2015

(51) Int. Cl.
*G01R 31/3187*    (2006.01)
*G01R 31/317*    (2006.01)

(52) U.S. Cl.
CPC .... *G01R 31/31725* (2013.01); *G01R 31/31718* (2013.01)

(58) Field of Classification Search
CPC ... G06F 1/08; G06F 11/3024; G06F 11/3062; G06F 1/04; G06F 1/3206; G01R 31/31725; G01R 31/31718; G01R 29/0885; G01R 31/308; G01R 31/2834; H04B 2001/71365; G11C 7/22; H03L 1/00
See application file for complete search history.

(56) References Cited

U.S. PATENT DOCUMENTS

| | | | |
|---|---|---|---|
| 5,875,119 A * | 2/1999 | Bauman et al. | 702/181 |
| 7,921,312 B1 * | 4/2011 | Pennanen | G06F 1/3296 327/524 |
| 8,010,317 B1 * | 8/2011 | Pennanen et al. | 702/182 |
| 2006/0212263 A1 * | 9/2006 | Koehler et al. | 702/182 |
| 2010/0057400 A1 * | 3/2010 | Chou et al. | 702/182 |
| 2012/0254670 A1 * | 10/2012 | Frazier et al. | 714/47.3 |
| 2013/0311799 A1 * | 11/2013 | Fitzpatrick et al. | 713/320 |

* cited by examiner

*Primary Examiner* — Vinh Nguyen
(74) *Attorney, Agent, or Firm* — Min-Lee Teng; Litron Patents & Trademark Office

(57) ABSTRACT

A method of determining the performance of a chip of an integrated-circuit design comprises instantiating a plurality of HPM in the integrated-circuit design to generate the performance of the chip according to a performance function defined by a polynomial comprising a plurality of terms, wherein each term of the polynomial comprises an exponent of a value generated by a corresponding one of the plurality of HPM(s) and a corresponding coefficient, wherein the coefficients are determined through a regression process with sample chips of the integrated-circuit design having known performance, so that the performance of each chip other than the sample chips can be determined by the performance function and the values of the plurality of HPM(s) of the chip.

11 Claims, 4 Drawing Sheets

US 9,244,122 B2

METHOD OF DETERMINING PERFORMANCE OF A CHIP OF AN INTEGRATED-CIRCUIT DESIGN AND AN APPARATUS AND AN INTEGRATED CIRCUIT USING THE SAME

BACKGROUND OF THE INVENTION

1. Field of the Invention

The invention relates in general to testing an integrated circuit and, in particular, to binning the performance of the integrated circuit.

2. Description of the Prior Art

Conventionally, function and AC scan patterns are used to test the functionalities and the performance of an integrated circuit. That is, functional and AC patterns are used to verify the correctness and operating speed of the chip, wherein a clocking speed is fed into the chip along with the patterns.

FIG. 1 illustrates a conventional flow of correlating actual speed of a chip with functional test patterns. In step 101, the chip is tapped out after all the design has been layout and verified. In step 102, after the chip is fabricated, post-silicon testing and data can be collected for further analyses. In step 103, the correlation between the performance of the chip and the functional/AC-Scan patterns can be determined. In step 104, performance binning using the above-mentioned correlation can be performed. However, it's costly and time consuming to correlate the actual speed with a large number of functional/AC patterns.

In another aspect of the conventional method, critical paths of a chip are observed to obtain the delay of the critical paths so as to determine the performance of the chip. However, thousands of paths may become candidates of critical paths in the post-silicon stage. A single ROSC (Ring Oscillator) or duplicated critical path is not effective to correlate so many critical paths varying in the post-silicon stage. Consequently, it is not an efficient way to correlate the actual speed with critical paths of a chip.

Therefore, what is needed is an effective and efficient way to determine the performance, or speed, of a chip.

SUMMARY OF THE INVENTION

One objective of present invention is to provide an efficient way to determine the performance of an integrated circuit by instantiating a plurality of HPM in the integrated circuit to generate the performance of the integrated circuit according to a performance function, wherein each term of the performance function is based on the values of the HPM(s) and the weighting of each term is determined through machine leaning of a set of sample integrated circuits.

Another objective of present invention s to provide a self-binning system to bin chips into different grades of speed, wherein the performance of a chip can be determined through an on-chip BIST (Built In Self Test) module which obtains a value of the performance function according to the values of HPM(s) on the chip and the learned weightings associated with the values of HPM(s).

In one embodiment, a method of determining the performance of an integrated circuit, the method comprising the steps of: disposing a plurality of HPM (hardware performance monitor) in each of a first plurality of integrated circuits, wherein each HPM generates a value for generating the performance of the integrated circuit; providing a performance function comprising a plurality of terms according to values generated by the plurality of HPM(s), wherein a weight is associated with each term of the performance function; determining the weight of each term according to a set of integrated circuits of the first plurality of integrated circuits, wherein the performance of each of the set of integrated circuits is known; and determining the performance of the integrated circuit by obtaining a value of the performance function according to the values of the HPM(s) of the integrated circuit and the weights associated with the values of the HPM(s).

In one embodiment, an apparatus for determining the performance of an integrated circuit of a plurality of integrated circuits is disclosed, the apparatus comprising: a plurality of HPM(s) (hardware performance monitor) in the integrated circuits, wherein each HPM generates a value for generating the performance of the integrated circuit; a storage unit for storing a plurality of weights of a performance function comprising a plurality of terms according to the values generated by the plurality of HPM(s), wherein each term of the performance function is respectively associated with a weight of the plurality of weights, wherein the weight of each term is determined according to a first set of integrated circuits, wherein the performance of each of the first set of integrated circuits is known; and a BIST module for determining the performance of the integrated circuit by obtaining a value of the performance function according to the values of the HPM(s) of the integrated circuit and the weights associated with the values of the HPM(s).

In one embodiment, a binning system to bin a plurality of integrated circuits into a plurality of grades of performance, wherein each of the plurality of integrated circuits has the apparatus for determining the performance of an integrated circuit of a plurality of integrated circuits, comprising: an interface capable of coupling to each of the plurality of integrated circuits to obtain the performance of the integrated circuit through the apparatus of the integrated circuit, for binning the plurality of integrated circuits into a plurality of grades of performance.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

Figure 1:
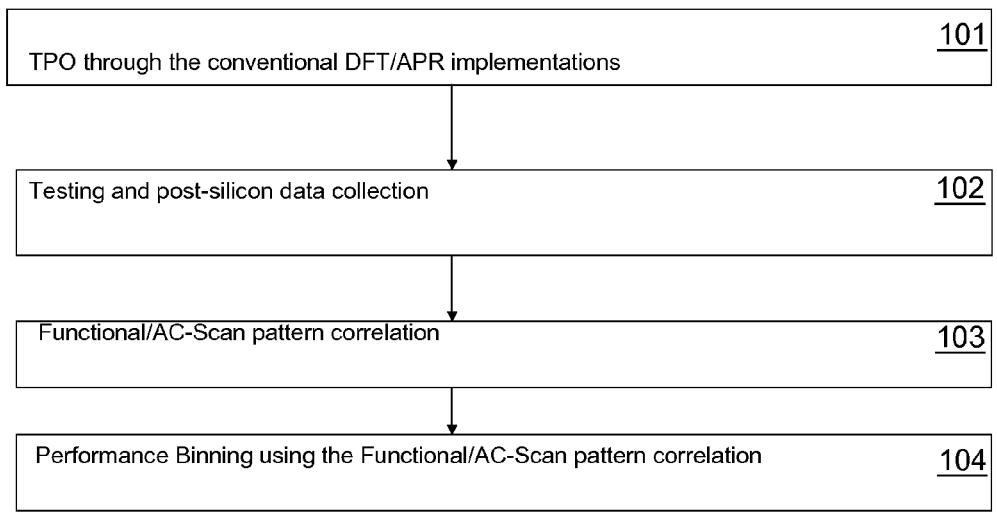
FIG. 1 illustrates a conventional flow of correct actual speed of a chip using functional test patterns.
Figure 2:
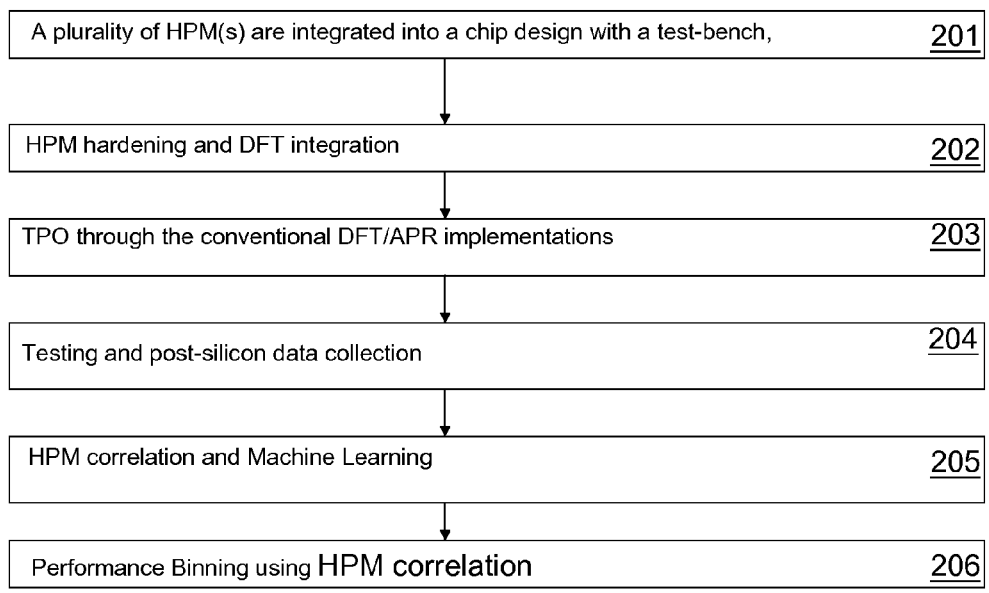
FIG. 2 illustrates a flow of using HPM(s) in a chip to perform self binning automatically through a BIST module inside the chip.

The detailed explanation of the present invention is described as following. The described preferred embodi- FIG. 2 illustrates a flow of using HPM(s) in a chip to do performance binning automatically through a BIST module inside the chip. In step 201, pluralities of HPM(s) are integrated into a chip design with a test-bench to verify the integration, which can be compiled by a HPM complier. In step 202, HPM(s) hardening and DFT integration can be performed; in step 203, the chip can be tapped out after all the design has been layout and verified. In step 204. After the chip is fabricated, post-silicon testing and HPM(s) data can be collected for further analyses. In step 205, HPM(s) data and performance correlation can be determined by a set of sample chips, wherein each of the sample chip has a known performance using methods such as in circuit emulations or static timing analyses based on a SDF (Standard Delay Format) construction imitating the OCV (On-Chip Variation) influence based on the HPM(s) data generated from real silicon, the correlation can be represented by a performance function to predict the performance of an integrated circuit through machine learning technique using linear or polynomial regressions to derive the performance function according to the correlations between the HPM(s) data and performances of the sample chips. Please note that sample chips can be randomly selected from different runs or batches fabricated from the foundry. Each term of the performance function has a weighting factor that can be determined according to the correlations of the data generated by the HPM(s) and the known performance of the sample chips. In step 206, based on the data from the HPM(s) and the weighting factors associated with the data of HPM(s), each chip can evaluate its own performance by integrating the performance function into each chip.

In some conditions, the number of HPM(s), the locations of the HPM(s) and each term of the performance function can be adjusted to represent the true performance of the chip as needed. After the performance function is finalized and integrated into the chips, a self-binning system can be provided to bin all the chips into multiple grades of performance automatically to save time and cost. By using the method of present invention, post-silicon tuning and PVT compensation can be performed to increase the yield of the chips as well. In addition, the method of present invention can be used for the refinement of timing sign-off methodology.

In one embodiment, each HPM comprises a counting circuit to generate a count value indicating the frequency of a signal of the integrated circuit, wherein the performance function is expressed as: $f(x) = w_0 + w_{11}x_1 + w_{12}x_1^2 + w_{21}x_2 + w_{22}x_2^2 + w_{n1}x_n + w_{n2}x_n^2$, wherein each of the $x_1, x_2 \ldots x_n$ and corresponds to a count value of a HPM, respectively. In one embodiment, each HPM comprises a ring oscillator to generate a count value indicating the frequency of the ring oscillator. Please note that the above performance function is just an example, present invention is not limited to a particular form of a performance function. For instance, the term of f(x) can include higher order of count values, such as $x^3$ or $x^4$, to match the true performance or speed of the chip. In one embodiment, the performance is the operating frequency of the integrated circuit.

In one embodiment, an apparatus for determining the performance of an integrated circuit of a plurality of integrated circuits is disclosed, the apparatus comprising: a plurality of HPM(s) (hardware performance monitor) in the integrated circuits, wherein each HPM generates a value for generating the performance of the integrated circuit; a storage unit for storing a plurality of weights of a performance function comprising a plurality of terms according to the values generated by the plurality of HPM(s), wherein each term of the performance function is respectively associated with a corresponding weight of the plurality of weights, wherein the weight of each term is determined according to a set of integrated circuits of the plurality of integrated circuits, wherein the performance of each of the set of integrated circuits is known; a BIST module for determining the performance of the integrated circuit of the plurality of integrated circuits by obtaining a value of the performance function according to the values of the HPM(s) of the integrated circuit and the weights stored in the storage unit of the integrated circuit.

In one embodiment, the apparatus described above, the performance of an integrated circuit comprises the operating frequency of the integrated circuit, wherein each HPM generate a count value indicating the frequency of a signal of the integrated circuit. In one embodiment, the integrated circuit comprises a JTAG port which is electrically connected to the BIST module to communicate with a self-binning system. In one embodiment, each HPM comprises a ring oscillator to generate a count value indicating the frequency of the ring oscillator.

Figure 3A:
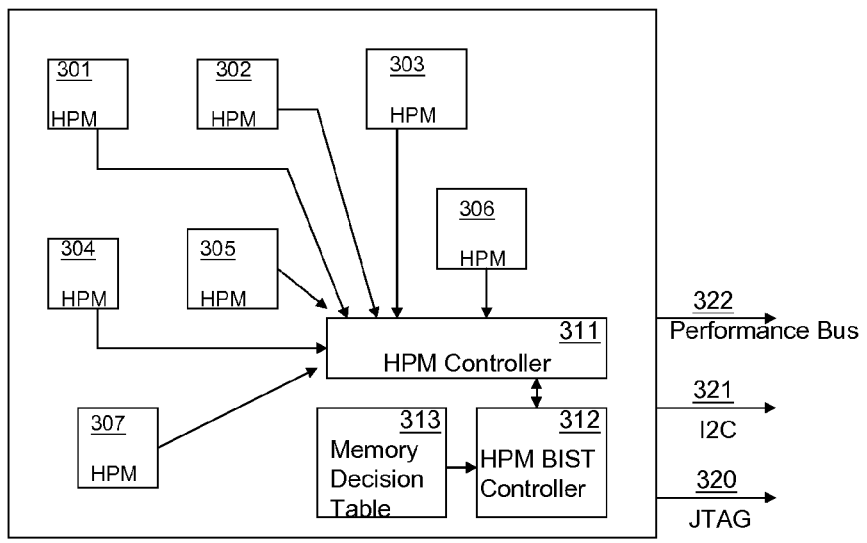
FIG. 3A depicts a diagram of a chip using HPM(s) connecting in parallel to a controller and a BIST module to automatically determine the speed of the chip in accordance with one embodiment of this invention.

FIG. 3A depicts a diagram of a chip using HPM(s) connecting in parallel to a controller and a BIST module to automatically determine the speed of the chip. In FIG. 3A, a plurality of HPM(s) 301, 302, 303, 304, 305, 306, 307 are disposed in the chip and connected to a HPM controller 311 in parallel. In each HPM, there is a counter to record the activities of the signals such as the frequency of a ring oscillator to indicate the performance of a local region where the HPM is located. In addition, there is a memory to store a decision table 313 such as all the weighting factors corresponding to the counter values respectively. A BIST module 312 can be integrated to the chip to communicate with the controller to determine the performance or speed of the chip. A chip bus, such as JTAG bus 320 or I2C bus 321, can be used to communicate with an external system such as a binning system to bin the chips into multiple grades of speed. The output of the chip performance or speed can be merged with a chip bus, such as JTAG 320 bus or I2C bus 321, or carried on an independent performance bus 322.

Figure 3B:
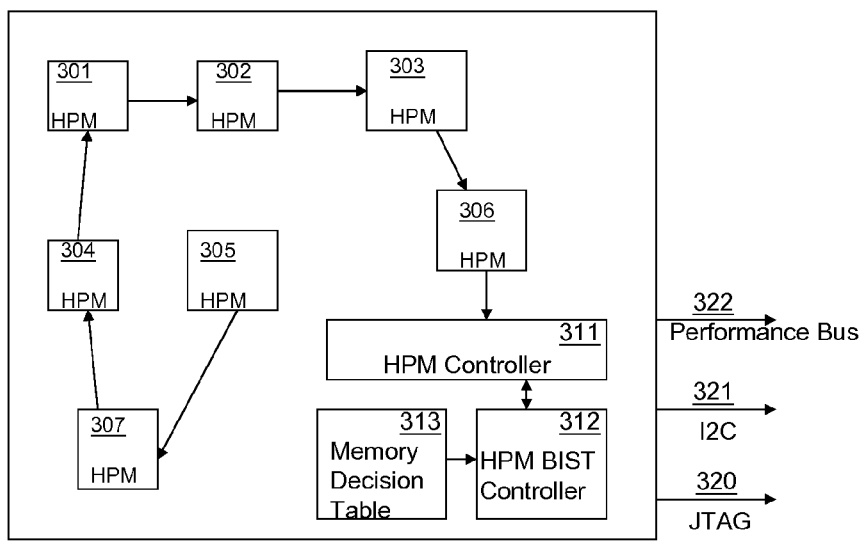
FIG. 3B depicts a diagram of a chip using HPM(s) connecting in series to a controller and a BIST module to automatically determine the speed of the chip in accordance with one embodiment of this invention.

FIG. 3B depicts a diagram of a chip using HPM(s) connecting in series to a controller and a BIST module to automatically determine the speed of the chip. In FIG. 3B, a plurality of HPM(s) 301, 302, 303, 304, 305, 306, 307 are disposed in the chip and connected to a HPM controller 311 in parallel. In each HPM, there is a counter to record the activities of the signals such as the frequency of a ring oscillator to indicate the performance of a local region where the HPM is located. In addition, there is a memory to store a decision table 313 such as all the weighting factors corresponding to the counter values respectively. A BIST module 312 can be integrated to the chip to communicate with the controller to determine the performance or speed of the chip. A chip bus, such as JTAG bus 320 or I2C bus 321, can be used to communicate with an external system such as a binning system to bin the chips into multiple grades of speed. The output of the chip performance or speed can be merged with a chip bus, such as JTAG 320 bus or I2C bus 321, or carried on an independent performance bus 322.

Figure 3C:
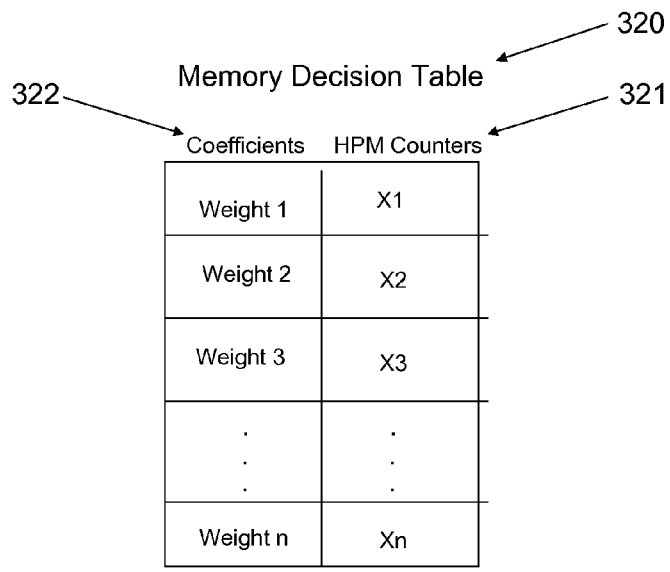
FIG. 3C depicts a diagram of memory decision table to store the weights of the performance function in accordance with one embodiment of this invention.

FIG. 3C depicts a diagram of a memory decision table 320 which can be a programmable decision table (PDT) of the chip used in FIGS. 3A and 3B. In one embodiment, the performance function can be expressed as:

$$f(x) = w_0 + w_{11}x_1 + w_{12}x_1^2 + w_{21}x_2 + w_{22}x_2^2 + w_{n1}x_n + w_{n2}x_n^2,$$

wherein $x_1, x_2 \ldots$ and $x_n$, is the counter value of each of the HPM counters 321 respectively, $w_0$ is a constant and $w_{11}, w_{12}, w_{21}, w_{22} \ldots w_{n1}, w_{n2}$ are coefficients 322 of terms in the performance function, respectively. A BIST module obtains a value of the performance function according to the counter values of the HPM(s) and the coefficients stored in the programmable decision table. The programmable decision table can be stored in a memory device such as flash memory.

Figure 4:
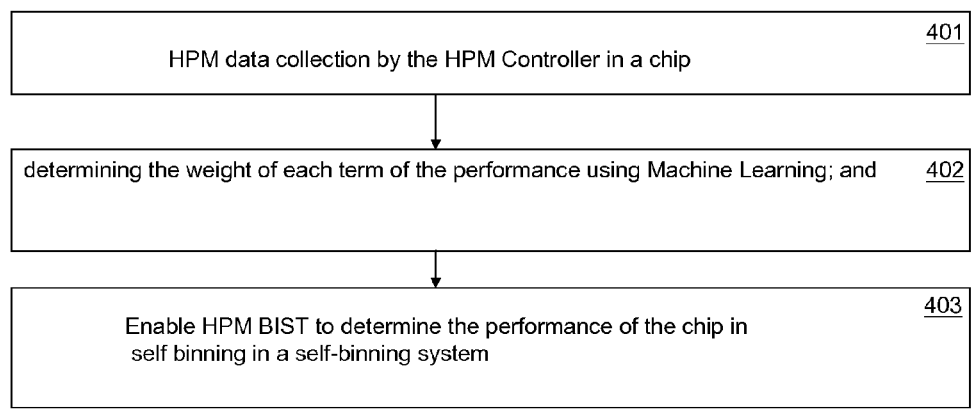
FIG. 4 depicts an algorithm to generate the performance of the chip shown in the diagrams in FIGS. 3A and 3B.

FIG. 4 depicts an algorithm to generate the performance of the chip shown in the diagrams in FIGS. 3A and 3B. In step 401, HPM data are collected by the HPM controller; in step 402, a performance function is used to obtain the performance or speed of the chip. After the coefficients are determined through a set of sample chips using machine learning technique, the coefficients can be written back to a programmable decision table inside the chip; and, in step 403, a HPM-BIST module of the chip can be enabled to generate the performance or speed of the chip automatically in a self-binning system.

Figure 5:
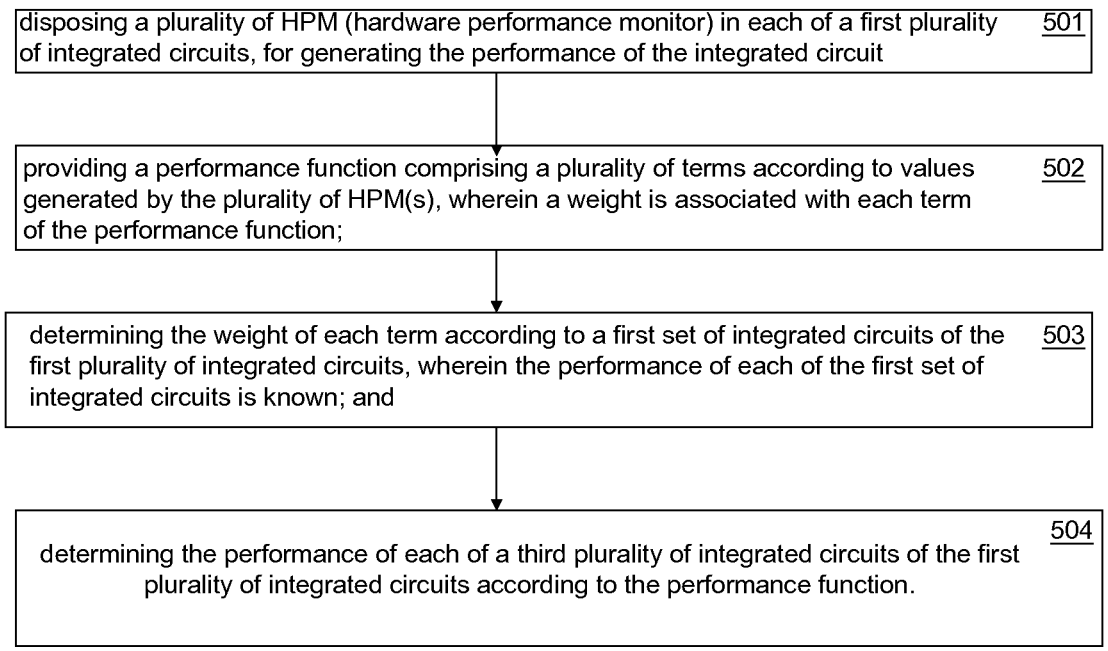
FIG. 5 depicts a flowchart to determine the performance of an integrated circuit in accordance with one embodiment of this invention.

In one embodiment, FIG. 5 shows a flowchart of determining the performance of an integrated circuit. In step 501, a plurality of HPM (hardware performance monitor) are disposed in each of a first plurality of integrated circuits, for generating the performance of the integrated circuit; in step 502, provide a performance function comprising a plurality of terms according to values of HPM(s), wherein a weight is associated with each term of the performance function; in step 503, the weight of each term is determined according to a first set of integrated circuits of the first plurality of integrated circuits, wherein the performance of each of the first set of integrated circuits is known; and, in step 504, determining the performance of each of a third plurality of integrated circuits of the first plurality of integrated circuits according to the performance function based on the count values of the HPM(s) in the integrated circuit and the weights associated with the count values;

In one embodiment, an integrated circuit, comprising: a plurality of HPM(s) (hardware performance monitor) in the integrated circuits, wherein each HPM generates a value for generating the performance of the integrated circuit; a storage unit for storing a plurality of weights of a performance function comprising a plurality of terms according to the values generated by the plurality of HPM(s), wherein each term of the performance function is respectively associated with a corresponding weight of the plurality of weights; and a BIST module for determining the performance of the integrated circuit of the plurality of integrated circuits by obtaining a value of the performance function according to the values of the HPM(s) in the integrated circuit and the weights in the storage unit. 13. In one embodiment, the obtained value of the performance function is the maximum operating frequency of the chip. In one embodiment, the integrated circuit comprises a JTAG port to output the maximum operating frequency of the chip.

In one embodiment, a binning system to bin a plurality of integrated circuits into a plurality of grades of performance, wherein each of the plurality of integrated circuits has the apparatus for determining the performance of an integrated circuit of a plurality of integrated circuits, comprising: an interface coupled to each of the plurality of integrated circuits to obtain the performance of the integrated circuit through the apparatus of the integrated circuit, for binning the plurality of integrated circuits into a plurality of grades of performance. After the chips are binned into multiple grades of performance or speeds, an operating voltage of the chip can be adjusted higher so that the chip can meet the performance or speed specification or requirements for applications.

Please note that although the above embodiments uses an integrated IC as examples, present invention can be used in die to die, wafer to wafer sorting or any other sizes of integrated circuits.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. An apparatus for determining the performance of an integrated circuit, comprising:
a plurality of HPM(s) (hardware performance monitor) in the integrated circuit, wherein each HPM generates a value for generating the performance of the integrated circuit;
a storage unit for storing a plurality of coefficients of a polynomial that defines a performance function of the integrated circuit, wherein each term of the polynomial comprises a corresponding one of the plurality of coefficients and an exponent of a value generated by a corresponding one of the plurality of HPM(s); and
a BIST module for determining the performance of the integrated circuit by obtaining a value of the performance function according to the values of the HPM(s) in the integrated circuit and the plurality of coefficients in the storage unit.

2. The apparatus according to claim 1, wherein the performance of the integrated circuit is an operating frequency of the integrated circuit.

3. The integrated circuit according to claim 2, further comprising a JTAG port to output the operating frequency of the integrated circuit.

4. The apparatus according to claim 1, wherein each HPM comprises a ring oscillator to generate a count value indicating the frequency of the ring oscillator.

5. An integrated circuit, comprising:
a plurality of HPM(s) (hardware performance monitor), wherein each HPM generates a value for generating the performance of the integrated circuit;
a storage unit for storing a plurality of coefficients of a polynomial that defines a performance function of the integrated circuit, wherein each term of the polynomial comprises a corresponding one of the plurality of coefficients and an exponent of a value generated by a corresponding one of the plurality of HPM(s); and
a BIST module for determining the performance of the integrated circuit by obtaining a value of the performance function according to the values of the HPM(s) in the integrated circuit and the plurality of coefficients in the storage unit.

6. The integrated circuit according to claim 5, wherein the HPM(s) are connected in parallel to a controller for collecting all the data from the HPM(s).

7. The integrated circuit according to claim 5, wherein the HPM(s) are connected in series to a controller for collecting all the data from the HPM(s).

8. The integrated circuit according to claim 5, wherein the obtained value of the performance function is the maximum operating frequency of the integrated circuit.

9. The integrated circuit according to claim 8, further comprising a JTAG port to output the maximum operating frequency of the integrated circuit.

10. A binning system to bin an integrated circuit recited as in claim 5, comprising:
   an interface coupling to the integrated circuit to obtain the performance of the integrated circuit.

11. The binning system according to claim 10, wherein the interface is a JTAG port.

\* \* \* \* \*